United States Patent [19]

Lindsey

[11] Patent Number: 4,823,022

[45] Date of Patent: Apr. 18, 1989

[54] APPARATUS AND METHOD FOR SENSING POWER LINE CONDITIONS

[75] Inventor: Keith E. Lindsey, La Canada, Calif.

[73] Assignee: Lindsey Manufacturing Company, Azusa, Calif.

[21] Appl. No.: 211,131

[22] Filed: Jun. 22, 1988

Related U.S. Application Data

[63] Continuation-in-part of Ser. No. 50,968, May 15, 1987; abandoned.

[51] Int. Cl.$^4$ .............................................. H01H 3/26
[52] U.S. Cl. .................... 307/149; 307/140; 324/126; 361/115; 174/139
[58] Field of Search .............. 307/149, 150, 151, 131, 307/152, 148; 340/870.16, 870.17, 310 R, 310 A; 361/115, 156; 324/126, 72, 96; 200/148 R, 148 A, 148 C, 148 D, 148 E, 148 F, 149; 174/139 R

[56] References Cited

U.S. PATENT DOCUMENTS

| | | | |
|---|---|---|---|
| 2,874,310 | 2/1959 | Young | 307/38 X |
| 3,671,688 | 6/1972 | Nitta | 361/115 X |
| 3,689,777 | 9/1972 | Nitta | 307/140 |
| 3,736,440 | 5/1973 | Nitta et al. | 361/115 X |
| 3,780,349 | 12/1973 | Nitta et al. | 361/115 |
| 3,863,145 | 1/1975 | Kelly et al. | 324/126 X |
| 3,932,810 | 1/1976 | Kohler et al. | 324/126 |
| 4,408,185 | 10/1983 | Rasmussen | 340/310 R |
| 4,409,428 | 10/1983 | Dey et al. | 174/139 X |
| 4,471,232 | 9/1984 | Peddie et al. | 307/40 X |
| 4,471,355 | 9/1984 | Hardy et al. | 324/96 X |
| 4,542,338 | 9/1985 | Arditty et al. | 324/96 X |
| 4,553,188 | 11/1985 | Aubrey et al. | 361/115 |
| 4,578,639 | 3/1986 | Miller | 324/126 X |

Primary Examiner—William M. Shoop, Jr.
Assistant Examiner—Paul Ip
Attorney, Agent, or Firm—Christie, Parker & Hale

[57] ABSTRACT

A line condition sensing device, e.g. a current transformer and/or a voltage transformer, is embedded in a pole mounted, power line supporting insulator to form an integral unit therewith. One end of the insulator carries a pole mounting base. The other end of the insulator carries a power line receiving clamp. The line condition sensing device is connected in parallel with a hot power line by taps to permit conditions to be monitored without cutting or dead ending the line. The device is installed on a hot line by opening the power line receiving clamp of the original insulator, holding the power line in spaced relationship from the original insulator while replacing it with the new insulator, resecuring the power line on the clamp of the new insulator, and then connecting the taps to the hot power line.

41 Claims, 5 Drawing Sheets

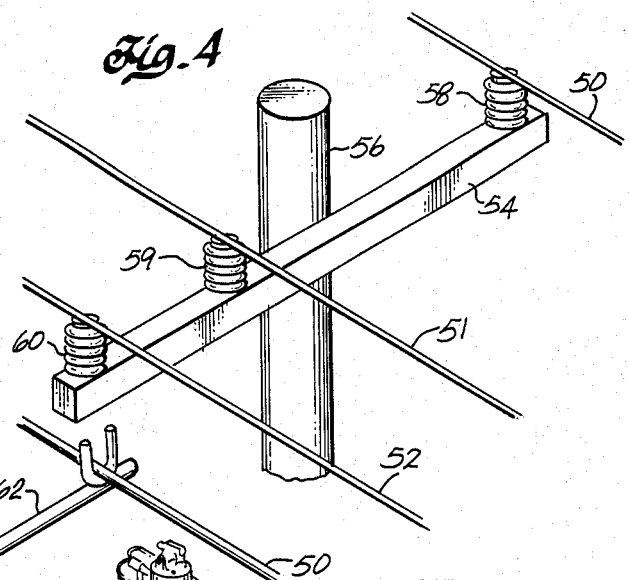
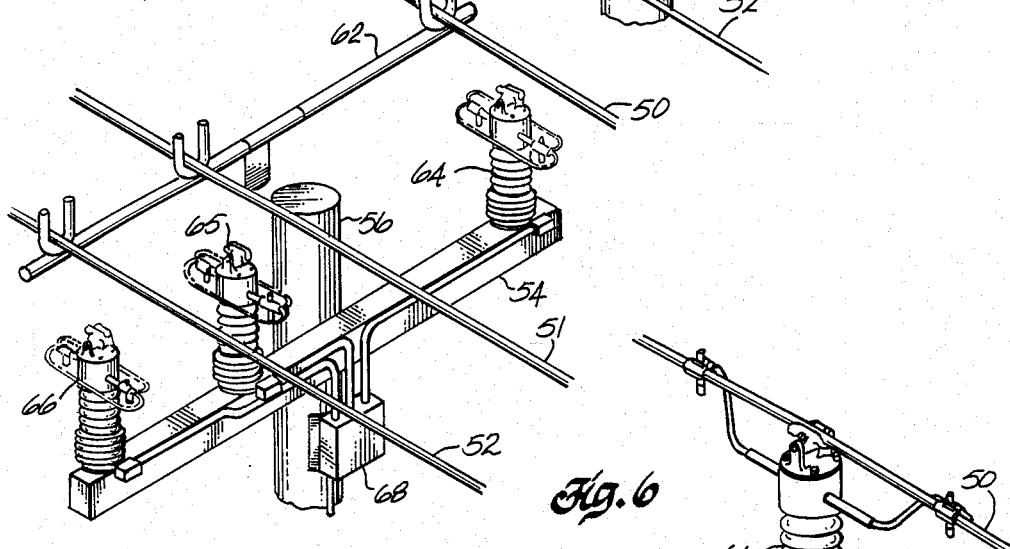
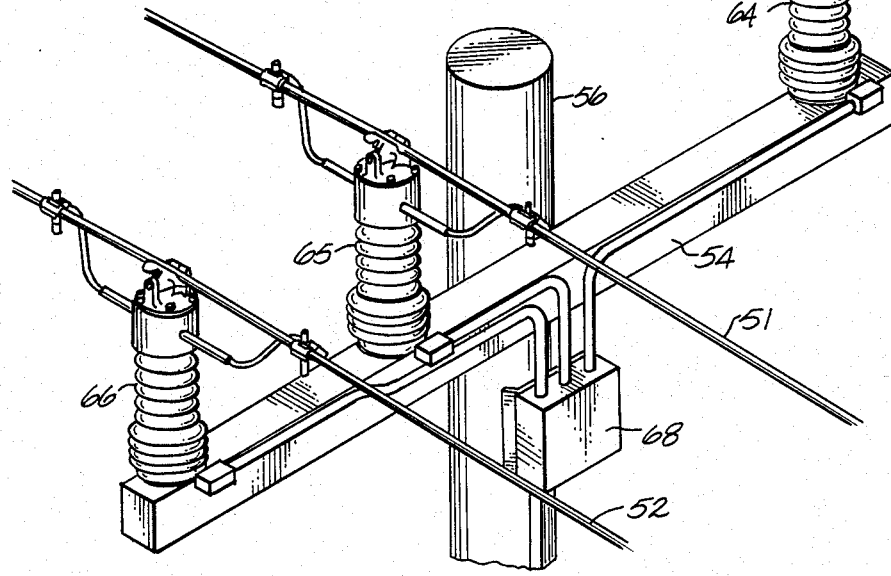

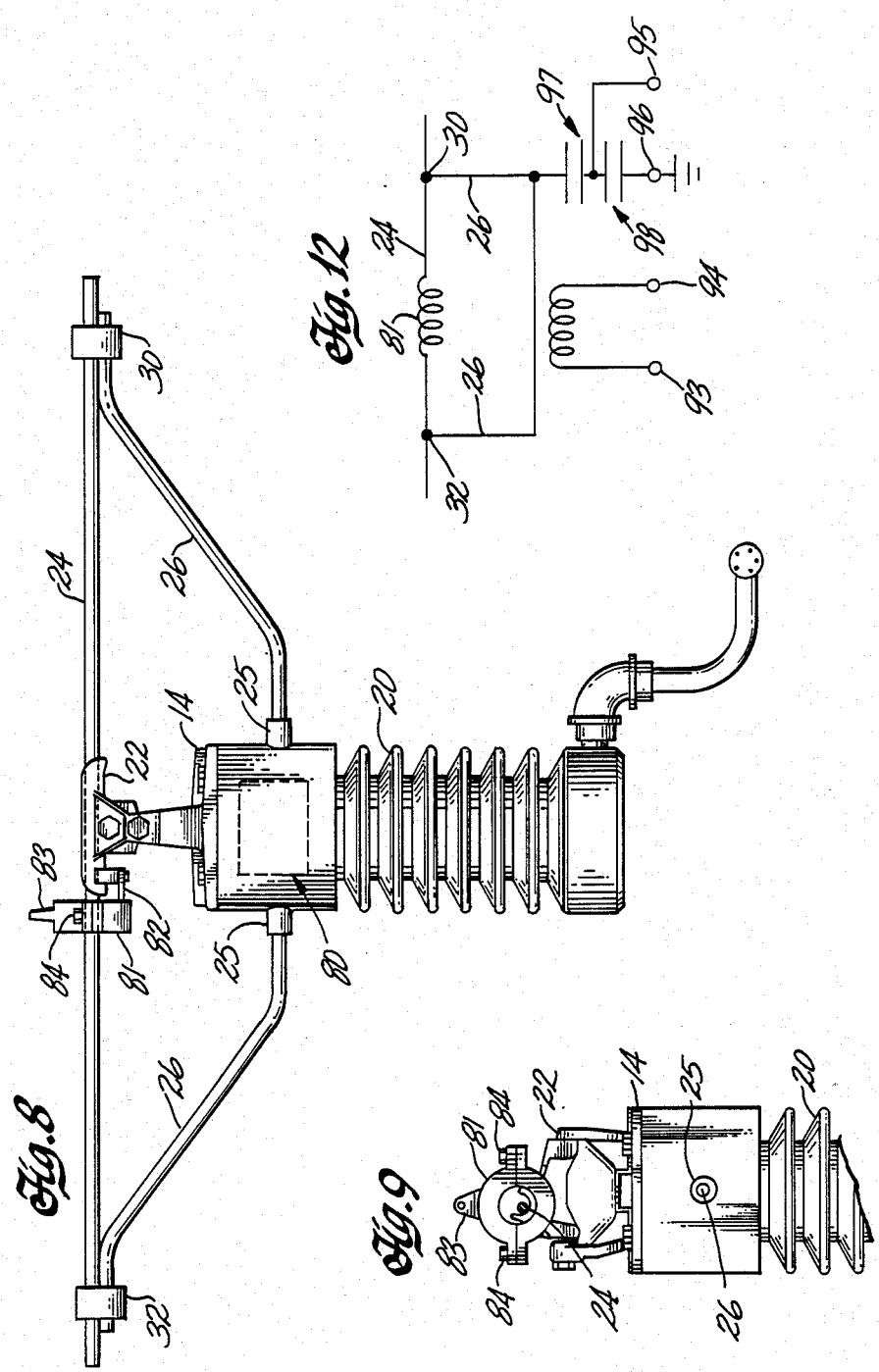

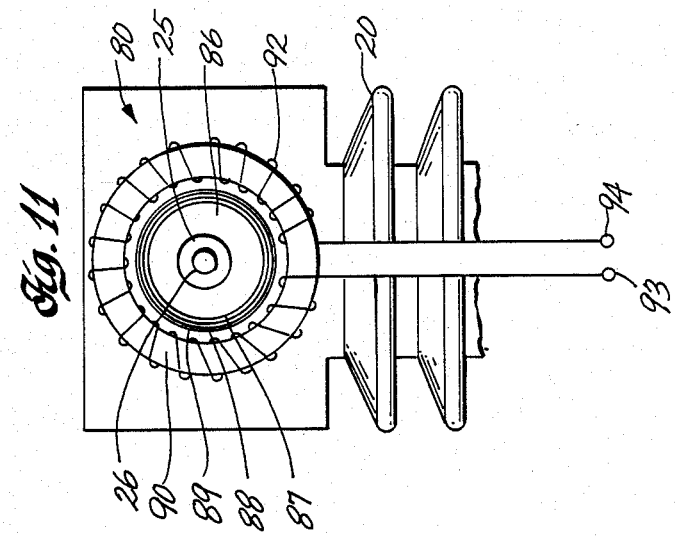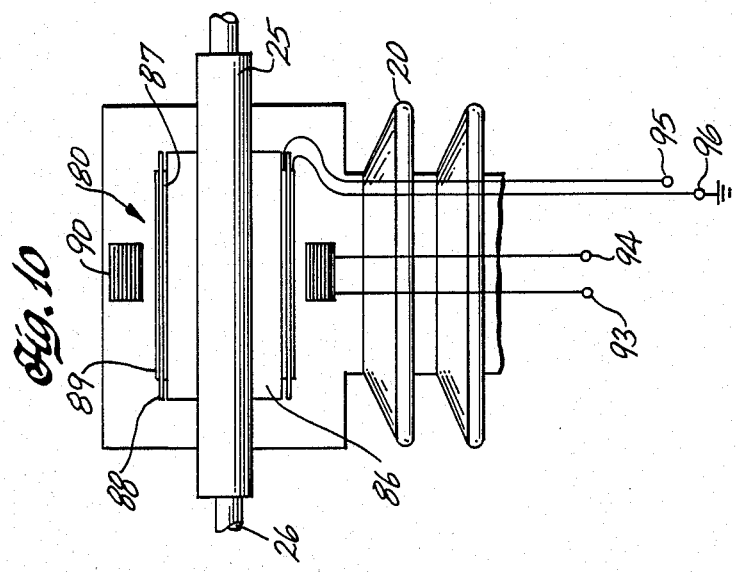

APPARATUS AND METHOD FOR SENSING POWER LINE CONDITIONS

CROSS-REFERENCE TO RELATED APPLICATIONS

This is a continuation-in-part of application Ser. No. 050,968, filed May 15, 1987 now abandoned.

BACKGROUND OF THE INVENTION

This invention relates to electrical power transmission, and more particularly, to apparatus and a method for sensing power line conditions.

In recent years, it has become common practice to sense power line conditions with a current transformer and/or a voltage transformer for the purposes of energy management, ground fault detection, and system measurement and control. A frequent use of such information about power line conditions is to optimize the power factor by means of power capacitor switching.

Typically, a current transformer and/or a voltage transformer are packaged as self-contained units which are mounted on the power pole near a power line supporting insulator. The connection to the power system is made by dead ending the power line on one side of the insulator and connecting the transformer package in series with the line. Specifically, the power line is cut, dead end clamps are installed, and the leads of the transformer package are connected to the dead end clamps. It is difficult, if not impossible, to carry out this installation procedure while the power line is "hot", i.e., carrying electrical power.

SUMMARY OF THE INVENTION

According to one aspect the invention a line condition sensing device, e.g. a current transformer and/or a voltage transformer, is incorporated into the body of a pole mounted, power line supporting insulator. Specifically, a line condition sensing device is embedded in the insulator to form an integral unit therewith. One end of the insulator carries a pole mounting base. The other end of the insulator carries a power line receiving clamp. A substantial weight and space reduction results because of the use of the power line supporting insulator as a housing for the line condition sensing device.

According to another aspect of the invention, a line condition sensing device is connected in parallel with a power line to permit conditions to be monitored without cutting or dead ending the line. Preferably, the condition sensing device is connected to the "hot" intact power line by means of taps. If the line condition sensing device is incorporated into the power line supporting insulator, as described in the preceding paragraph, the device is preferably installed on a hot line by opening the power line receiving clamp of the original insulator, holding the power line in spaced relationship from the original insulator while replacing it with the new insulator, resecuring the power line on the clamp of the new insulator, and then connecting the taps to the hot power line. A feature of this aspect of the invention is the use of a choke around the segment of the power line between the taps so as to divert the majority of the current carried by the line through the line condition sensing device.

BRIEF DESCRIPTION OF THE DRAWINGS

A specific embodiment of the best mode contemplated of carrying out the invention is illustrated in the drawings, in which:

FIGS. 4, 5, and 6 are perspective views of a power pole transmitting three phase electrical power, illustrating the preferred method for installing the apparatus of FIG. 1;

FIG. 8 is a side elevation view of other line condition sensing apparatus incorporating principles of the invention;

FIG. 9 is an end elevation view of the apparatus of FIG. 8;

FIG. 10 is a side sectional view of the current and voltage sensing circuitry of the apparatus of FIG. 8;

FIG. 11 is an end sectional view of the current and voltage sensing circuitry of the apparatus of FIG. 8; and FIG. 12 is a schematic circuit diagram of the current and voltage sensing circuitry of the apparatus of FIG. 8.

DETAILED DESCRIPTION OF THE SPECIFIC EMBODIMENT

Figure 1:
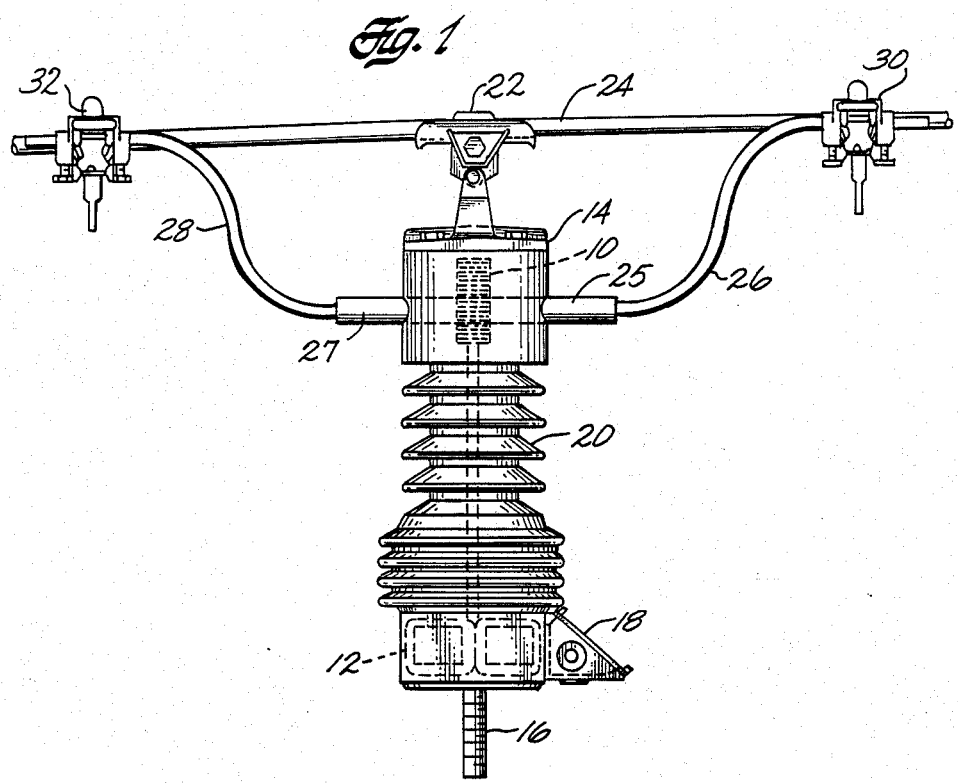
FIG. 1 is a side elevation view of line condition sensing apparatus incorporating principles of the invention.

In FIG. 1 power line condition sensing apparatus comprises a current transformer 10, a voltage transformer 12, a top mounting plate 14, a pole mounting base 16, and a terminal box 18 all incorporated in a power line insulator 20 in an integral structure. Insulator 20 is preferably made from Polysil. Preferably, current transformer 10, voltage transformer 12, plate 14, base 16, and terminal box 18 are embedded in the Polysil material during the molding process for insulator 20. A conventional trunnion clamp 22 mounted on plate 14 supports the weight of a power line 24 whose conditions are to be sensed. A metal, i.e. aluminum, pipe 25, which forms part of current transformer 10, extends from opposite sides of insulator 20. An uninsulated jumper cable 26 passes through pipe 25 and is electrically connected to power line 24 by hot line taps 30 and 32, respectively. Thus, the described apparatus performs two functions—the traditional function of a power line insulator, namely to bear the weight of the power line in spaced relation from the pole, and also the function of current and voltage transformers, namely to sense the conditions of the line. The electrical connections to the power line are made without dead ending, and therefore can be established while the power line is "hot", i.e. carrying electrical power.

Figure 2:
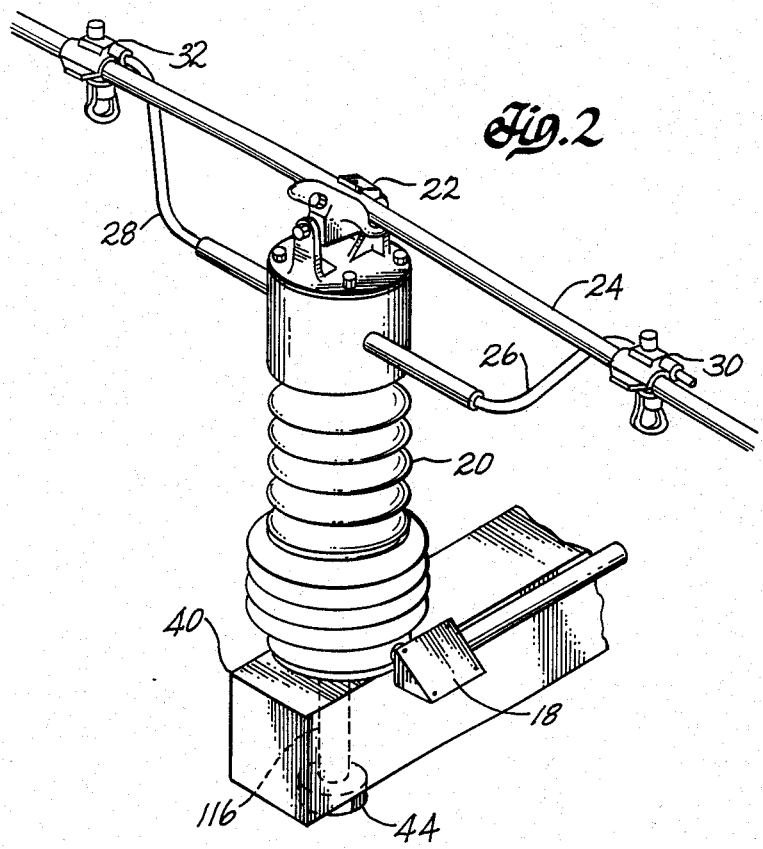
FIG. 2 is a perspective view of the apparatus of FIG. 1 mounted vertically on the crossarm of a power pole.

In FIG. 2 the apparatus of FIG. 1 is vertically mounted on a crossarm 40. The stud of base 16 passes through a hole in crossarm 32 and is secured thereto by a bolt 44.

Figure 3:
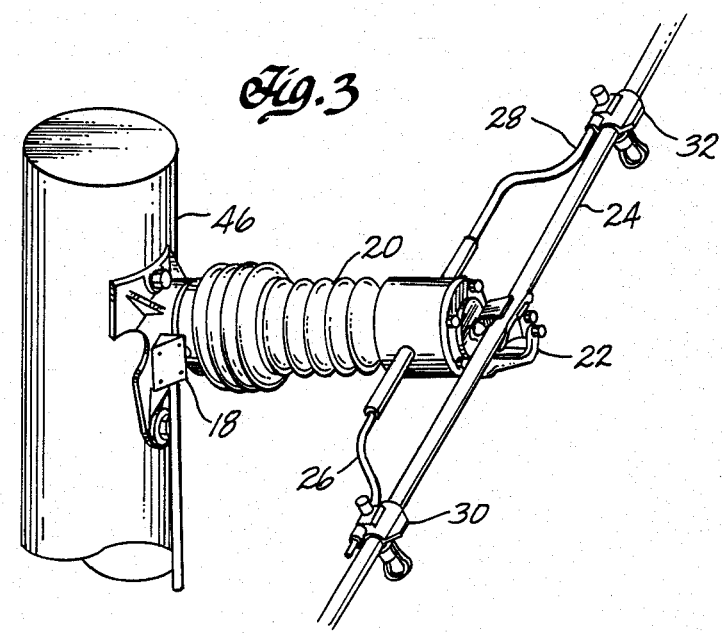
FIG. 3 is a perspective view of the apparatus of FIG. 1 mounted horizontally on a power pole.

In FIG. 3 the apparatus of FIG. 1 is horizontally mounted on a power pole 46 by a conventional horizontal mounting base. In this arrangement the mounting bolt 16 (FIG. 1) is replaced with a shorter bolt that allows attachment to a standard horizontal mounting bracket.

The preferred method for installing the described apparatus is illustrated in FIGS. 4, 5 and 6. In FIG. 4, prior to installation of the apparatus, power lines 50, 51, and 52 of a three phase power transmission system are supported on a crossarm 54 of a power pole 56 by conventional insulators 58, 59, and 60.

As illustrated in FIG. 5, power lines 50, 51, and 52 are unclamped from the insulators and lifted above crossarm 54 by an insulated boom 62 sufficiently to provide the necessary work space for removing insulators 58, 59, and 60 and mount in their place units 64, 65 and 66 of the apparatus of FIG. 1. Boom 62 temporarily supports the weight of power lines 50, 51, and 52 during the insulator replacing procedure.

As illustrated in FIG. 6 after mounting units 64, 65, and 66 on crossarm 54, boom 62 is lowered and removed, power lines 50, 51 and 52 are secured in the trunnion clamps of unit 64, 65 and 66, respectively, and the hot line taps are connected to the power lines, thereby completing the installation.

The condition sensing devices in unit 64, 65, and 66 are electrically connected through the junction boxes to a remote transceiver device (RTD) 68 of conventional design. The same holes used for insulators 58, 59, and 60 can be used to secure unit 64, 65 and 66. Because of the integral construction, very little additional weight must be carried by crossarm 54. Therefore, reinforcement of crossarm 54 is not usually required.

Figure 7:
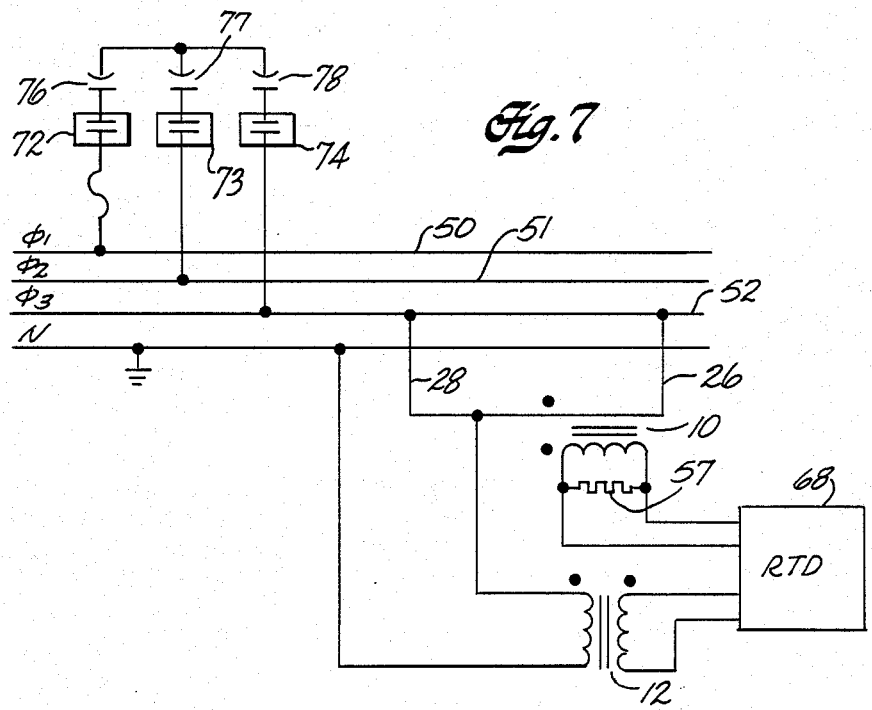
FIG. 7 is an electrical schematic diagram illustrating the connection of the apparatus of FIG. 1 to the three phase power system of FIGS. 4, 5, and 6.

FIG. 7 shows an electrical schematic diagram of the connections of unit 66 to power line 52 as illustrative of the connections of the other units to the other power lines. Jumper cables 26 and 28 and the primary of current transformer 10 form a parallel circuit with the portion of power line 52 between hot line taps 30 and 32. A resistor 57 is shunted across the secondary of current transformer 10. The primary of voltage transformer 12 is connected from one side of the primary of current transformer 10 to ground. The secondary of current transformer 10 and the secondary of voltage transformer 12 are connected to RTD 68. One important application of the invention is to improve the power factor of the system. To this end, RTD 68 senses the power factor and opens and closes power switches 72, 73, and 74 to selectively switch in and out of the system capacitors 76, 77, and 78, respectively, so as to adjust the power factor.

In summary, the conditions of a power line, i.e. current and/or voltage are monitored by the same insulative apparatus that also supports the power line. The condition sensing apparatus is electrically connected without dead ending the power line. As a result, it can be installed while the power line is hot using standard hot line maintenance techniques, substituting the apparatus of the invention for standard power line supporting insulators.

In the embodiment of FIG. 8 elements, in common with the embodiment of FIG. 1 bear the same reference numerals. Current and voltage sensing circuitry represented schematically as a block 80 is embedded in the top of insulator 20. In this embodiment, no sensing circuitry is embedded in the bottom of insulator 20. A split annular choke 81 surrounds power line 24 and is connected to trunion clamp 22 by a bracket 82. Choke 81 preferably comprises an inner core made of annular alternating laminations of insulative and ferro magnetic material, such as iron, surrounded by a housing cast, for example, from aluminum. If desired, the housing could have a "hot eye" 83 to facilitate handling. During installation, to place choke 81 around power line 24, its two halves are separated and then bolted together by fasteneres 84. Choke 81 provides a large inductance that substantially blocks the flow of current through power line 24 and diverts most of the current to jumper cable 26 instead. Typically, as much as 99 percent of the current flows through jumper cable 26. As a result, there is negligible current induced in jumper cable 26 due to current flow in power line 24, and the power factor of the current and voltage sensed by circuitry 80 accurately reflects the power factor of the power transmission on power line 24. Without choke 81, the phase of the current through jumper cable 26 would depend on the current induced therein by the current flow through power line 24.

As illustrated in FIGS. 10 and 11, sensing circuitry 80 comprises an insulative sleeve 86 surrounding pipe 25, an electrical conductor 87 surrounding sleeve 86, an insulative layer 88 surrounding conductor 87, and an electrical conductor 89 surrounding insulative layer 88. A transformer comprising a laminated annular core 90 and a winding 92 surrounds conductor 89. Terminals 93 and 94 are connected to the ends of winding 92. A terminal 95 is connected to conductor 87. A terminal 96 is connected to conductor 89. As illustrated in FIG. 12, jumper 26 and conductor 87 form a capacitor 97 and conductors 87 and 89 form a capacitor 98. Capacitors 97 and 98 serve to step down the voltage between line 24 and ground.

The described embodiment of the invention is only considered to be preferred and illustrative of the inventive concept; the scope of the invention is not to be restricted to such embodiment. Various and numerous other arrangements may be devised by one skilled in the art without departing from the spirit and scope of the invention. For example, either a current sensor or a voltage sensor alone could be employed, or the sensor could take other forms than a transformer. Instead of hot line taps, the electrical connection to the power line could be made by two conventional aligned trunnion clamps mounted on the insulator.

What is claimed is:

1. Electrical power line sensing apparatus comprising:
    an electrical insulator having first and second ends;
    means for sensing power line conditions embedded in the insulator;
    first and second cables coupled to the sensing means and extending therefrom outside the insulator;
    a power line clamp attached to the first end of the insulator; and
    a pole mounting base attached to the second end of the insulator.

2. The apparatus of claim 1, in which the base is adapted for horizontal mounting of the insulator.

3. The apparatus of claim 1, in which the base is adapted for vertical mounting of the insulator.

4. The apparatus of claim 1, in which the power line clamp is a trunnion type clamp.

5. The apparatus of claim 1, in which the sensing means comprises a current transformer.

6. The apparatus of claim 1, in which the sensing means comprising a voltage transformer.

7. The apparatus of claim 6, in which the sensing means additionally comprises a current transformer.

8. The apparatus of claim 5, in which the current transformer is embedded near the first end of the insulator.

9. The apparatus of claim 8, in which the voltage transformer is embedded near the second end of the insulator.

10. The apparatus of claim 6, in which the voltage transformer is embedded near the second end of the insulator.

11. In a power transmission system having power poles and at least one power line, the combination comprising:
an electrical insulator mounted on the pole to support the line in space relationship from the pole;
means mounted on the pole for sensing power line conditions;
a first cable connected at one end to the sensing means;
a second cable connected at one end to the sensing means;
means for connecting the other end of the first cable to the power line; and
means for connecting the other end of the second cable to the power line to place the sensing means in parallel circuit with the power line between the connections.

12. The combination of claim 11, in which the first and second connecting means comprise hot line taps.

13. The combination of claim 12, in which the sensing means comprises a current transformer.

14. The combination of claim 13, in which the sensing means additionally comprises a voltage transformer.

15. The combination of claim 14, in which the current and voltage transformers are embedded in the insulator.

16. The combination of claim 13, in which the current transformer is embedded in the insulator near the line.

17. The combination of claim 14, in which the voltage transformer is embedded in the insulator near the pole.

18. The combination of claim 15, in which the insulator is horizontally mounted on the pole.

19. The combination of claim 15, in which the pole has a crossarm and the insulator is vertically mounted on the crossarm.

20. The combination of claim 13, in which the current transformer has a primary winding connected in series with the cables.

21. The combination of claim 14, in which the voltage transformer has a primary winding connected between one of the cables and ground.

22. A method for monitoring the conditions of a power line supported by an insulator that is mounted on a power pole, the method comprising the steps of:
detaching the power line from the insulator;
lifting the power line away from the insulator;
dismounting the insulator from the power pole;
mounting on the power line a new insulator incorporating means for sensing power line conditions;
lowering the power line onto the new insulator;
attaching the power line to the new insulator; and
electrically connecting the sensing means to the power line.

23. The method of claim 22, in which the sensing means has a first cable and a second cable and the connecting step comprises connecting the first cable to the power line on one side of the new insulator and connecting the second cable to the power line on the other side of the new insulator.

24. The method of claim 23, in which the connecting step connects the first and second cables to the power line with hot line taps.

25. The method of claim 22, in which the line is hot during the connecting step.

26. The apparatus of claim 1, additionally comprising a choke attached to the power line clamp.

27. The apparatus of claim 26, in which the choke is a split annular choke.

28. The apparatus of claim 27, in which the choke comprises an inner core made of annular alternating laminations of insulative and ferromagnetic material and a housing surrounding the inner core.

29. The apparatus of claim 28, in which a hot eye is formed on the housing.

30. The apparatus of claim 1, in which the sensing means comprises first and second capacitors connected in series and a terminal connected to the junction of the first and second capacitors.

31. The apparatus of claim 30, in which the sensing means additionally comprises a current transformer.

32. The combination of claim 11, additionally comprising an inductance connected in series with the power line between the cables.

33. The combination of claim 11, in which the inductance comprises a choke surrounding the power line.

34. The combination of claim 33, in which the choke is a split annular choke.

35. The combination of claim 34, in which the choke comprises an inner core made of annular alternating laminations of insulative and ferromagnetic material and a housing surrounding the inner core.

36. The combination of claim 35, in which a hot eye is formed on the housing.

37. The combination of claim 11, in which the sensing means comprises first and second capacitors connected in series and a terminal connected to the junction of the first and second capacitors.

38. The combination of claim 37, in which the sensing means additionally comprises a current transformer.

39. The combination of claim 38, in which the first and second capacitors and the current transformer are embedded in the insulator.

40. The method of claim 23, additionally comprising the steps of separating a split choke into two parts, placing the two parts around the power line between the cables, and bolting the two parts together to surround the power line with the choke between the cables.

41. The method of claim 40, additionally comprising the step of attaching the choke to the new insulator after bolting the two parts together.

* * * * *